US011183359B2

(12) United States Patent
Nishinaka et al.

(10) Patent No.: US 11,183,359 B2
(45) Date of Patent: Nov. 23, 2021

(54) CHARGED PARTICLE BEAM APPARATUS (71) Applicant: Hitachi High-Tech Corporation, Tokyo (JP)

(72) Inventors: Kenichi Nishinaka, Tokyo (JP); Tsunenori Nomaguchi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/042,659

(22) PCT Filed: Mar. 29, 2018

(86) PCT No.: PCT/JP2018/013398
§ 371 (c)(1),
(2) Date: Sep. 28, 2020

(87) PCT Pub. No.: WO2019/186938
PCT Pub. Date: Oct. 3, 2019

(65) Prior Publication Data
US 2021/0035770 A1 Feb. 4, 2021

(51) Int. Cl.
*H01J 37/09* (2006.01)
*H01J 37/10* (2006.01)
*H01J 37/244* (2006.01)

(52) U.S. Cl.
CPC .............. *H01J 37/09* (2013.01); *H01J 37/10* (2013.01); *H01J 37/244* (2013.01);
(Continued)

(58) Field of Classification Search
CPC .......... H01J 37/09; H01J 37/10; H01J 37/244; H01J 2237/0455; H01J 2237/0458; H01J 2237/2448; H01J 2237/1501
See application file for complete search history.

(56) References Cited

U.S. PATENT DOCUMENTS 8,018,814 B2 * 9/2011 Ogasawara ....... G02F 1/134309
369/112.02
11,067,391 B2 * 7/2021 Sato ................... G01N 23/2251
(Continued)

FOREIGN PATENT DOCUMENTS

| JP | 59-98447 A | 6/1984 |
|---|---|---|
| JP | 5-21033 A | 1/1993 |

(Continued)

OTHER PUBLICATIONS

International Search Report (PCT/ISA/210) issued in PCT Application No. PCT/JP2018/013398 dated Jun. 26, 2018 with English translation (four (4) pages).

(Continued)

*Primary Examiner* — David A Vanore
(74) *Attorney, Agent, or Firm* — Crowell & Moring LLP (57) ABSTRACT

When a charged particle beam aperture having an annular shape is used, since a charged particle beam directly above the optical axis having the highest current density in the charged particle beam is blocked, it is difficult to dispose the charged particle beam aperture at an optimal mounting position. An charged particle beam apparatus includes a charged particle beam source that generates a charged particle beam, a charged particle beam aperture, a charged particle beam aperture power supply that applies a voltage to the charged particle beam aperture, an objective lens for focusing the charged particle beam on a sample, a detector that detects secondary charged particles emitted by irradiating the sample with the charged particle beam, a computer that forms a charged particle beam image based on the secondary charged particles detected by the detector, in which the position of the charged particle beam aperture is set so that the charged particle beam image does not move and changes concentrically in synchronization with the AC voltage, in a state where an AC voltage is applied to the (Continued)

charged particle beam aperture by the charged particle beam aperture power supply.

10 Claims, 5 Drawing Sheets

(52) U.S. Cl.
CPC ............. *H01J 2237/0455* (2013.01); *H01J 2237/0458* (2013.01); *H01J 2237/2448* (2013.01)

(56) References Cited

U.S. PATENT DOCUMENTS

| | | | |
|---|---|---|---|
| 11,069,505 B2* | 7/2021 | Nakano | H01J 37/153 |
| 2018/0114670 A1* | 4/2018 | Kawasaki | H01J 37/12 |
| 2018/0190469 A1* | 7/2018 | Cheng | H01J 37/141 |
| 2019/0393014 A1* | 12/2019 | Kawamoto | H01J 37/145 |
| 2020/0219697 A1* | 7/2020 | Hirano | H01J 37/1413 |
| 2021/0035770 A1* | 2/2021 | Nishinaka | H01J 37/244 |

FOREIGN PATENT DOCUMENTS

| | | |
|---|---|---|
| JP | 2000-77018 A | 3/2000 |
| JP | 2001-15059 A | 1/2001 |
| WO | WO 2016/174891 A1 | 11/2016 |

OTHER PUBLICATIONS

Japanese-language Written Opinion (PCT/ISA/237) issued in PCT Application No. PCT/JP2018/013398 dated Jun. 26, 2018 (four (4) pages).
Enyama M. et al., "Method of Improving Image Sharpness for Annular-Illumination Scanning Electron Microscopes", Japanese Journal of Applied Physics, 2016, pp. 1-4, vol. 55, Issue 06GD02, CrossMark (five (5) pages).

* cited by examiner

[FIG. 1]

FIG. 2A
TOP VIEW

FIG. 2B
CROSS-SECTIONAL VIEW

FIG. 2C
TOP VIEW

FIG. 2D
CROSS-SECTIONAL VIEW

CHARGED PARTICLE BEAM APPARATUS

TECHNICAL FIELD

The present invention relates to a charged particle beam apparatus that irradiates a sample with a charged particle beam.

BACKGROUND ART

As a background art in this technical field, there is disclosed in International Publication No. 2016/174891 (PTL 1). The charged particle beam apparatus, such as a scanning electron microscope (SEM) or a focused ion beam system (FIB), focuses a charged particle beam on a sample to perform nano-level observation, analysis, and processing. These charged particle beam apparatuses are widely used in the fields of semiconductors, materials, and biotechnology, which require observation, analysis, and processing at a nano level. Further, in various fields including the semiconductor field in which miniaturization is progressing, further improvement in image resolution and processing accuracy is required.

PTL 1 discloses a spherical aberration corrector that can be realized with a simple structure by having an entry plate and an exit plate, forming a circular opening in one of the plates and forming an annular opening in the other, and creating a divergence that eliminates positive spherical aberration by the electric field formed in the annular opening by applying a voltage between the entry plate and the exit plate. In addition, NPL 1 discloses that the depth of focus is improved by using an annular aperture.

CITATION LIST

Patent Literature

PTL 1: International Publication No. 2016/174891

Non-Patent Literature

NPL 1: Momoyo Enyama, Koichi Hamada, Muneyuki Fukuda and Hideyuki Kazumi, "Method of improving image sharpness for annular-illumination scanning electron microscopes," Japanese Journal of Applied Physics 55, 06GD02 (2016)

SUMMARY OF INVENTION

Technical Problem

As an aperture of the charged particle beam apparatus, a circular aperture having a hole is generally used, but an annular aperture is also known. NPL 1 discloses that the depth of focus is improved by using an annular aperture. Further, PTL 1 discloses that a spherical aberration correction effect is obtained by combining an annular electrode and a circular electrode and applying a voltage between the two electrodes.

In either case, it is necessary to dispose the center of the annular aperture or the annular electrode on the optical axis of the charged particle beam, and the charged particle beam immediately above the optical axis having the highest current density in the charged particle beam is blocked. For this reason, the optimal mounting position of an annular aperture or electrode does not coincide with the position where the charged particle beam image becomes brightest, whereas an aperture having a circular hole shape can be disposed at an appropriate position by disposing the aperture based on the position where the charged particle beam image becomes the brightest. This makes it difficult to adjust the optimal mounting position of the annular aperture or electrode. An object of the present invention is to provide a charged particle beam apparatus that can easily adjust an annular aperture to an appropriate position.

Solution to Problem

A charged particle beam apparatus according to an embodiment of the present invention includes a charged particle beam source that generates a charged particle beam, a charged particle beam aperture, a charged particle beam aperture power supply that applies a voltage to the charged particle beam aperture, an objective lens for focusing the charged particle beam on a sample, a detector that detects secondary charged particles emitted by irradiating the sample with the charged particle beam, a computer that forms a charged particle beam image based on the secondary charged particles detected by detector, in which the position of the charged particle beam aperture is set so that the charged particle beam image does not move and changes concentrically in synchronization with the AC voltage, in a state where an AC voltage is applied to the charged particle beam aperture by the charged particle beam aperture power supply.

Advantageous Effects of Invention

In particular, even an annular charged particle beam aperture whose position is difficult to set can be appropriately and easily disposed on the optical axis of a charged particle beam.

DESCRIPTION OF EMBODIMENTS

An embodiment of the present invention will be described with reference to drawings. However, the present embodiment is merely an example for realizing the present invention. Further, in each of the drawings, the same reference numerals are given to the common components.

Figure 1:
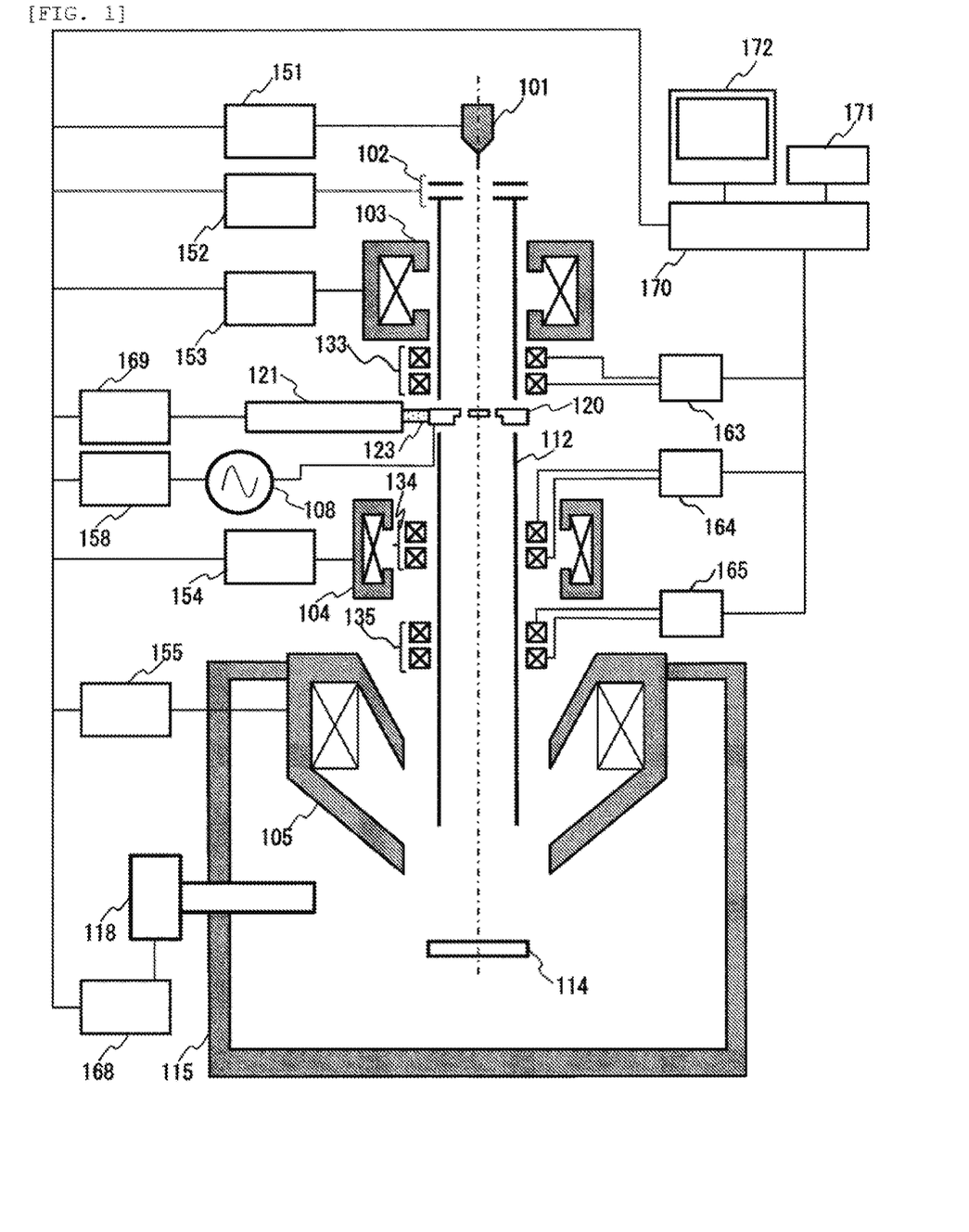
FIG. 1 is a schematic view of a charged particle beam apparatus.

FIG. 1 illustrates an outline of a charged particle beam apparatus. A charged particle beam apparatus includes, in the main part thereof, a charged particle beam source 101 that generates a charged particle beam, an acceleration electrode 102 that accelerates the charged particle beam emitted from the charged particle beam source 101, a beam tube 112 disposed from the accelerating electrode 102 to the vicinity of the lower end of an objective lens 105, first and second condenser lenses 103 and 104 for focusing the charged particle beam emitted from the charged particle beam source 101, a charged particle beam aperture 120 having an annular shape for shielding a part of charged particles emitted from the charged particle beam source 101, an insulating material 123 for electrically insulating the charged particle beam aperture 120, a charged particle beam aperture device 121 including a drive mechanism for moving the charged particle beam aperture 120, a charged particle beam aperture power supply 108 that applies a voltage to the charged particle beam aperture 120, a first deflector group 133 disposed closer to the charged particle beam source 101 than a charged particle beam aperture unit, a second deflector group 134 disposed closer to a sample than the charged particle beam aperture unit, a third deflector group 135 for scanning the charged particle beam on the sample, an objective lens 105 for focusing the charged particle beam on the sample, a sample chamber 115 in which a sample 114 is placed, and a detector 118 that detects secondary charged particles emitted from the sample. Here, the charged particle beam aperture power supply 108 can apply not only a DC voltage but also an AC voltage to the charged particle beam aperture 120. In addition, as a controller that controls each component of the above-described charged particle optical system, a charged particle beam source controller 151 that controls the charged particle beam source 101, an accelerating electrode controller 152 that controls the accelerating electrode 102, first and second condenser lens controllers 153 and 154 that controls the first and second condenser lenses 103 and 104, respectively, a charged particle beam aperture controller 169 that controls the charged particle beam aperture device 121, a charged particle beam power supply controller 158 that controls the charged particle beam power supply 108, a first deflector group controller 163 that controls the first deflector group 133, a second deflector group controller 164 that controls the second deflector group 134, a third deflector group controller 165 that controls the third deflector group 135, an objective lens controller 155 that controls the objective lens 105 are provided, and also, a detector controller 168 that controls the detector 118 is provided. These controllers are controlled by an integrated computer 170 that controls the operation of the entire charged particle beam apparatus and constructs a charged particle beam image. The integrated computer 170 is connected to a controller (keyboard, mouse, and the like) 171 and a display 172, an operator can input various instructions such as irradiation conditions, voltage conditions and position conditions of the charged particle beam aperture from the controller 171 and display the acquired image and the control screen on the display 172.

In the example of FIG. 1, the two condenser lenses 103 and 104 are provided, but the number of condenser lenses is not limited for the purpose of controlling charged particles incident on the objective lens 105. The objective lens 105 is provided with a lens that does not leak a magnetic field outside a magnetic path, but a type of lens that leaks a magnetic field out of a magnetic path, or a compound objective lens having both a type that leaks a magnetic field and a type that does not leak a magnetic field may be used. In addition, the condenser lenses 103 and 104 and the objective lens 105 may be an electrostatic lens for the above-described purpose, or may be an objective lens using both a magnetic lens and an electrostatic lens such as a booster optical system or a retarding optical system, and there is no limitation on the type of lens for the purpose of focusing the charged particle beam on the sample 114.

Further, in FIG. 1, the beam tube 112 is generally set to the GND potential (reference potential), but a predetermined voltage is applied to the booster optical system. For the purpose of covering the path of the charged particle beam, the shape and the number of constituent members are not limited. Further, the detector 118 that detects the secondary charged particles may be disposed in the sample chamber 115 as illustrated in FIG. 1. The detector 118 may be disposed in a column in which the charged particle optical system is mounted. Further, the detector 118 may be disposed both in the sample chamber 115 and in the column. For the purpose of detecting the secondary charged particles, the number and the location of the detector 118 are not limited. FIG. 1 illustrates a charged particle beam apparatus including one charged particle beam column, but a composite charged particle beam apparatus including a plurality of charged particle beam columns may be used.

Figure 2A:
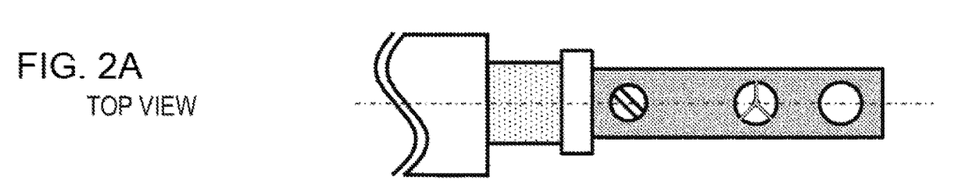
FIGS. 2A and 2B are schematic diagrams illustrating a configuration of a charged particle beam aperture unit.
Figure 2B:
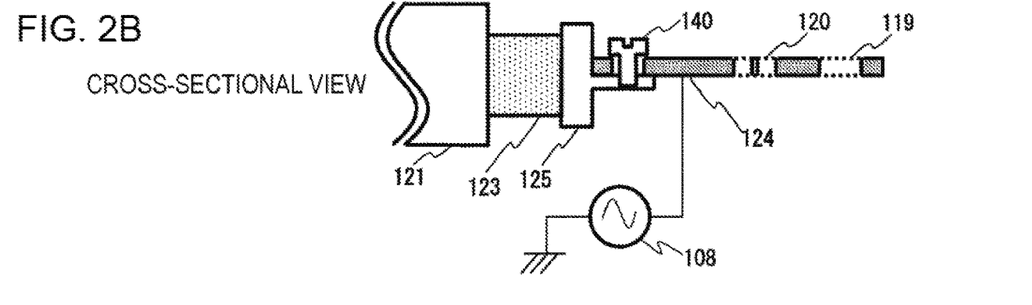
Figure 2C:
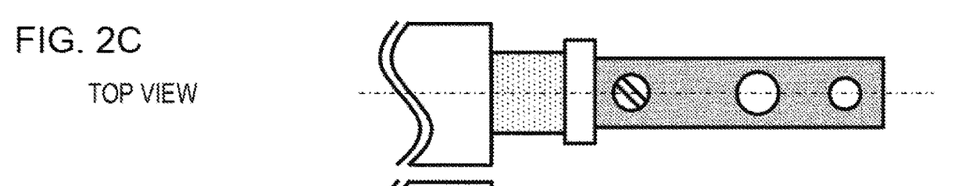
FIGS. 2C and 2D are schematic views illustrating a configuration of the charged particle beam aperture unit.
Figure 2D:
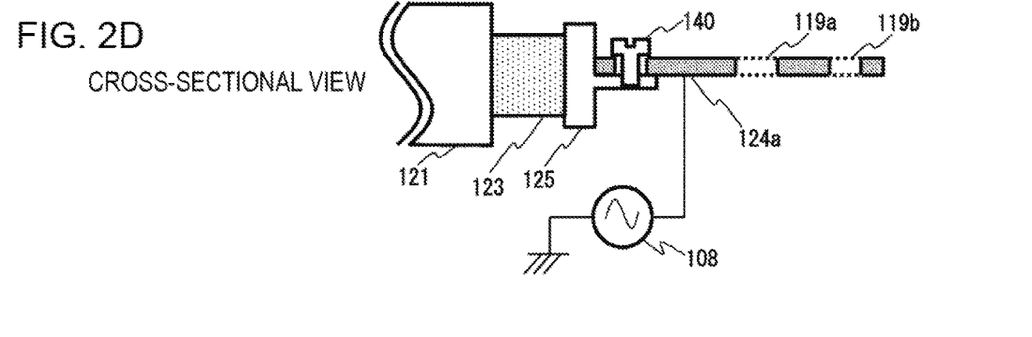

FIG. 2A illustrates an example of the configuration of the charged particle beam aperture. FIG. 2A is a top view, and FIG. 2B is a cross-sectional view. In the example of FIG. 2A, the charged particle beam aperture 120 having an annular shape is directly formed on a charged particle beam aperture plate 124, and a voltage is applied to the charged particle beam aperture plate 124 from the charged particle beam aperture power supply 108. Further, it is preferable that a charged particle beam aperture 119 having a circular hole shape is provided on the charged particle beam aperture plate 124 in order to adjust an optical axis of the charged particle optical system described later. The charged particle beam aperture plate 124 is attached to a charged particle beam aperture plate support base 125 by screws 140, and the charged particle beam aperture plate support 125 is supported by the insulating material 123. The present invention is not limited thereto, and the charged particle beam aperture plate 124 and the charged particle beam aperture plate support base 125 may be integrally formed. Further, since a voltage is applied to the charged particle beam aperture plate 124, the potential can be separated from the surrounding structures by the insulating material 123. Further, in the example of FIG. 2A, one charged particle beam aperture 120 is disposed on the charged particle beam aperture plate 124, but a plurality may be disposed. In the case where a plurality of apertures are disposed, there is an advantage that even when one aperture is contaminated or damaged, observation and processing can be resumed immediately by switching to another aperture. Further, the shapes of the plurality of charged particle beam apertures 120 may not be the same. In this case, there is an advantage that a charged particle beam aperture suitable for different observation conditions and processing conditions such as acceleration voltage can be properly used. When a plurality of charged particle beam apertures 120 having openings of the same size are disposed, at least one corresponding charged particle beam aperture 119 may be provided, and when a plurality of charged particle beam apertures 120 having openings of different sizes are disposed, it is preferable that the charged particle beam aperture 119 having a circular hole shape, having an opening corresponding to the size of the opening of the charged particle beam aperture 120 is disposed.

The present example is particularly effective when a charged particle beam aperture having an annular shape is used in the charged particle beam aperture unit, but the present example is also applicable to the case where the charged particle beam aperture 119 having a circular hole shape is used in the charged particle beam aperture unit.

Since the configuration of the charged particle beam aperture is the same as that of FIG. 2A, overlapping description is omitted, but FIG. 2B is an example in which the charged particle beam aperture 119 having a circular hole shape is directly formed on a charged particle beam aperture plate 124a, and a plurality of charged particle beam apertures 119a and 119b having openings of different sizes are provided. Of course, a plurality of charged particle beam apertures 119 having openings of the same size may be provided.

Figure 3A:
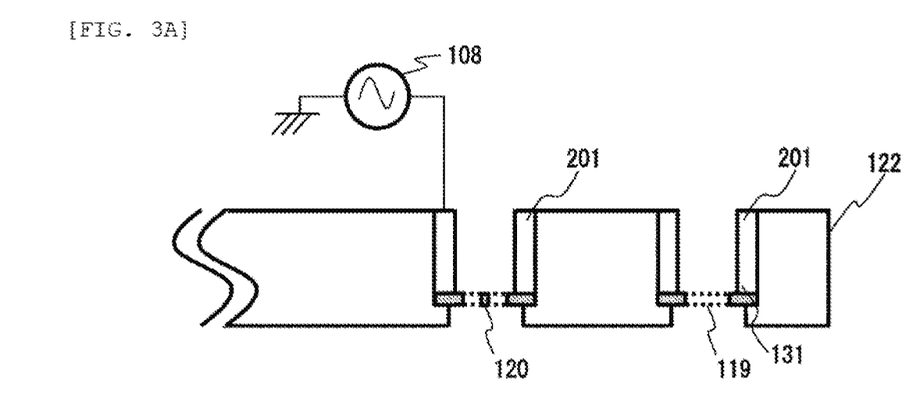
FIG. 3A is a schematic view illustrating a support structure of a charged particle beam aperture.

Hereinafter, a modified example of the support structure of the charged particle beam aperture 120 will be described. FIG. 3A is a support structure (cross-sectional view) for fixing the charged particle beam aperture 120 having an annular shape (the shape of the plate on which the aperture is formed does not matter, such as a circle, a square, or the like) to a charged particle beam aperture support base 122. In this example, the charged particle beam aperture 120 is placed in a concave portion of the charged particle beam aperture support base 122 and is held down by a press screw 201 having a thread cut on a side surface from above. The concave portion is formed by, for example, counterbore processing on the support base 122. In the example illustrated in the drawing, the screw portion is on the upper side (on the charged particle beam source side), but the screw portion may be on the lower side (on the objective lens side). Similarly, the charged particle beam aperture 119 having a circular hole shape is also supported by the charged particle beam aperture support base 122. Both the charged particle beam aperture support base 122 and the press screw 201 are conductors, and a voltage from the charged particle beam aperture power supply 108 is applied to the charged particle beam aperture 120 via these conductors. Further, instead of the charged particle beam aperture 120 having an annular shape in FIG. 3A, a charged particle beam aperture 119 having a circular hole shape may be used. In this case, a charged particle beam aperture unit corresponding to FIG. 2B is realized. The method of fixing the charged particle beam aperture to the charged particle beam aperture support base 122 illustrated in FIG. 3A is an example, and a spacer may be placed on the charged particle beam aperture, and the spacer may be fixed by a press plate, or other known methods can be applied.

Figure 3B:
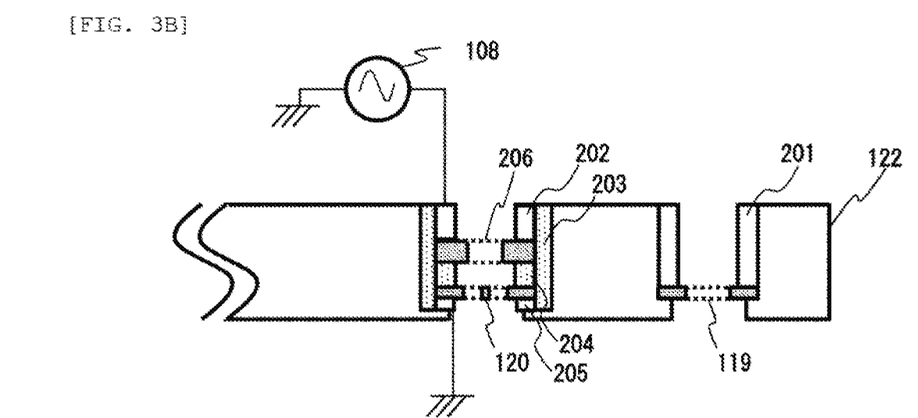
FIG. 3B is a schematic view illustrating a support structure of the charged particle beam aperture.

As described in PTL 1, FIG. 3B illustrates a configuration in which an aberration correction function is provided by superimposing a charged particle beam aperture 206 having a circular hole shape on the charged particle beam aperture 120 having an annular shape along the optical axis direction of the charged particle beam and applying a voltage between the two apertures. In this case, in order to make the superimposed charged particle beam aperture 120 having an annular shape and the charged particle beam aperture 206 having a circular hole shape have different potentials, the charged particle beam aperture 206 having a circular hole shape is supported by the support base 122 via the insulating material 203, and the charged particle beam aperture 120 having an annular shape and the charged particle beam aperture 206 having a circular hole shape are insulated by an insulating spacer 204. In addition, a conductive spacer 205 is disposed below the charged particle beam aperture 120 having an annular shape. In order to generate a voltage between the two apertures, a voltage from the charged particle beam aperture power supply 108 is applied to the charged particle beam aperture 206 having a circular hole shape via the press screw 202, and the charged particle beam aperture 120 having an annular shape is grounded via a conductive support base 122 and the conductive spacer 205. The charged particle beam aperture 120 having an annular shape may be floating. Further, a voltage from the charged particle beam aperture power supply 108 may be applied to the charged particle beam aperture 120 having an annular shape, and the charged particle beam aperture 206 having a circular hole shape may be grounded.

Figure 4:
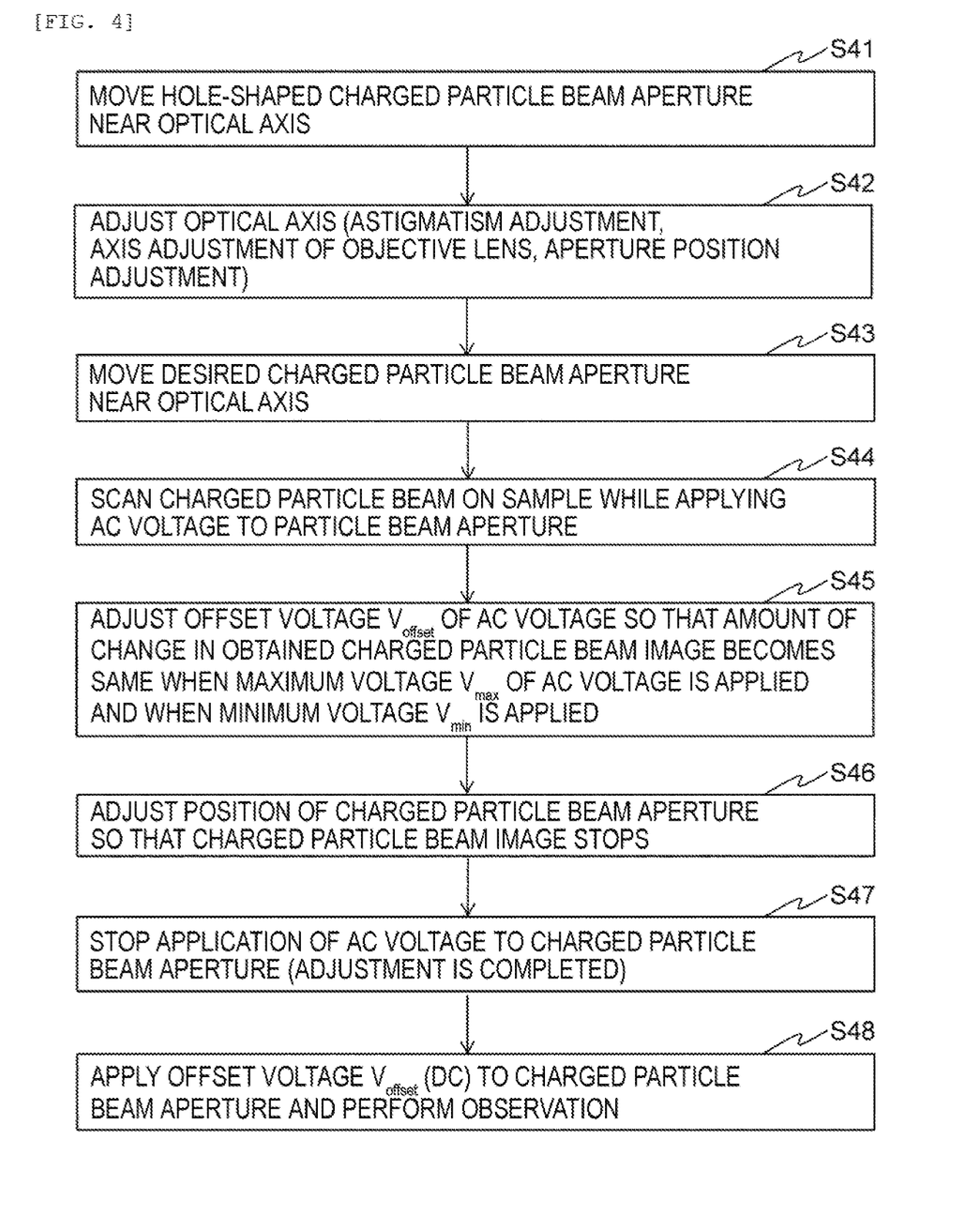
FIG. 4 is a flowchart illustrating a procedure for adjusting the charged particle beam aperture.

The procedure for adjusting the charged particle beam aperture in the present embodiment will be described with reference to FIG. 4. In this adjustment procedure, each controller of the charged particle optical system is controlled and executed by the integrated computer 170. First, the charged particle beam aperture 119 having a circular hole shape is disposed in the charged particle optical system, and adjustment necessary for acquiring a charged particle beam image including optical axis adjustment of the charged particle beam is performed (S41 and S42). Since the circular aperture is a general shape of a charged particle beam aperture, this adjustment is an operation normally performed by a user with a general charged particle beam apparatus. The optical axis adjustment includes astigmatism correction, axis adjustment of the objective lens, and position adjustment of the charged particle beam aperture 119. At this time, no voltage is applied from the charged particle beam aperture power supply 108 to the charged particle beam aperture. Steps S41 and S42 do not have to be performed every time the position of the charged particle beam aperture is adjusted, which is described later, and can be omitted if the optical axis has already been adjusted.

Figure 5:
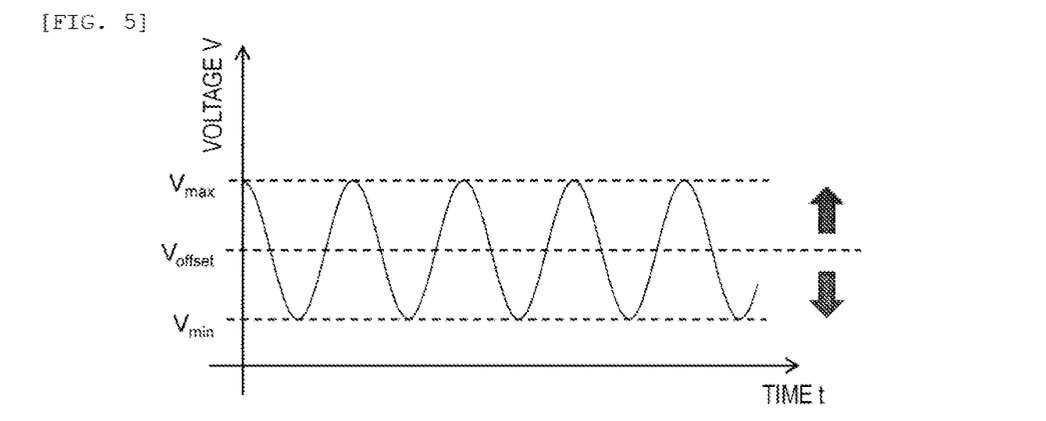
FIG. 5 is an example of an AC voltage applied to the charged particle beam aperture.

Next, the charged particle beam aperture 119 having a circular hole shape used for optical axis adjustment is switched to a charged particle beam aperture used for observation by the charged particle beam aperture 121, and is moved to the vicinity of the optical axis (S43). When the charged particle beam aperture used for observation is a charged particle beam aperture having a circular hole shape, the following adjustment is performed while keeping the charged particle beam aperture having a circular hole shape used for optical axis adjustment without switching. First, a charged particle beam is scanned on the sample while applying an AC voltage from the charged particle beam aperture power supply 108 to the charged particle beam aperture (S44). FIG. 5 illustrates an example (sine wave) of an AC voltage applied to the charged particle beam aperture. The AC voltage has a maximum voltage $V_{max}$, a minimum voltage $V_{min}$, and an offset voltage $V_{offset}$, and the charged particle beam aperture power supply controller 158 can increase or decrease the offset voltage $V_{offset}$ while keeping the amplitude of the AC voltage constant. By applying a voltage to the charged particle beam aperture, the charged particle beam aperture having a circular hole shape acts as a convex lens and the charged particle beam aperture having an annular shape acts as a concave lens with respect to the charged particle beam. By applying an AC voltage to the charged particle beam aperture, the lens strength as a convex lens or a concave lens changes periodically. Therefore, when the charged particle beam aperture is not disposed at an optimum position, in the obtained charged particle beam image, the center of the image moves in synchronization with the AC voltage, and when the charged particle beam aperture is disposed at the optimum position, the obtained charged particle beam image does not move, and the image changes concentrically. By utilizing this phenomenon, the position of the charged particle beam aperture is adjusted.

Further, when using a charged particle beam aperture having an annular shape as the charged particle beam aperture, as described above, the aperture acts as a concave lens by applying a voltage, it is possible to obtain an aberration correction effect by applying a positive voltage with respect to a reference voltage to the charged particle beam aperture having an annular shape when a voltage that has the opposite polarity to the charge of the charged particle beam, that is, a charged particle is an electron, and by applying a negative voltage with respect to the reference voltage to the charged particle beam aperture having an annular shape when the charged particle is a positive ion. Therefore, when using a charged particle beam aperture having an annular shape, first, the offset voltage $V_{offset}$ of the applied AC voltage is adjusted (S45). More specifically, the offset voltage $V_{offset}$ of the AC voltage is adjusted so that the amount of change in the obtained charged particle beam image becomes the same when the maximum voltage $V_{max}$ of the AC voltage is applied and when the minimum voltage $V_{min}$ is applied. For example, if the charged particle beam aperture is not disposed at an optimum position, the center of the obtained charged particle beam image moves in synchronization with the AC voltage, but in this case, the offset voltage $V_{offset}$ may be adjusted so that the amount of image movement when the applied voltage changes from $V_{offset}$ to $V_{max}$ is equal to the amount of image movement when the applied voltage changes from $V_{offset}$ to $V_{min}$. In addition, when the charged particle beam aperture is disposed at an optimum position, the obtained charged particle beam image does not move, and the image changes concentrically, but the offset voltage $V_{offset}$ may be adjusted so that the image blur amount when the applied voltage is $V_{max}$ is equal to the image blur amount when the applied voltage is $V_{min}$. The focal position of the charged particle beam is adjusted on the surface of the sample 114 by applying a DC voltage having the magnitude of the adjusted offset voltage $V_{offset}$ to the charged particle beam aperture having an annular shape.

When using a charged particle beam aperture having a circular hole shape as the charged particle beam aperture, and when it is not necessary to operate the charged particle beam aperture as a convex lens, an AC voltage with the offset voltage $V_{offset}$ fixed at 0 V (reference potential) may be applied to the charged particle beam aperture, and the step S45 becomes unnecessary.

Next, the position of the charged particle beam aperture is adjusted so that the movement of the center of the charged particle beam image stops (S46). In a state where the center of the charged particle beam image is stopped, it corresponds to the charged particle beam aperture being disposed at an optimum position. Thereafter, it may be confirmed whether the offset voltage $V_{offset}$ is appropriate, and may be adjusted if necessary. This confirmation is made based on whether or not the amount of image blur when the applied voltage is $V_{max}$ is equal to the amount of image blur when the applied voltage is $V_{min}$.

Thus, the adjustment of the charged particle beam aperture is completed, and the application of an AC voltage to the charged particle beam aperture is stopped (S47). In order to adjust the center of the optical axis of the charged particle beam aperture and the lens center of the objective lens more precisely, after step S46, the charged particle beam may be adjusted to pass through the lens center of the objective lens 105 by using the second deflector group 134. At the time of observation, when using a charged particle beam aperture having an annular shape as the charged particle beam aperture, in a state where a DC voltage having the magnitude of the offset voltage $V_{offset}$ adjusted in step S45 is applied to the charged particle beam aperture 120 having an annular shape, a charged particle beam image is formed by the integrated computer (S48).

The AC voltage applied to adjust the charged particle beam aperture described above is not limited to a sine wave. For example, a rectangular wave, a triangular wave, a sawtooth wave, or a composite waveform thereof may be used. For the purpose of adjusting the optical axis of the charged particle beam aperture, it is sufficient that the lens strength of the charged particle beam aperture can be periodically changed, and therefore, the type and waveform of the applied AC signal are not limited.

Further, the charged particle beam aperture may be moved manually, but it is more convenient if the charged particle beam aperture 121 has an electric drive function and can be controlled by the charged particle beam aperture controller 169. As one example of realizing the electric drive mechanism, a configuration may be adopted in which rough adjustment of the charged particle beam aperture is performed by a stepping motor and fine movement adjustment is performed by a piezo element. In addition, a configuration may be adopted in which both rough adjustment and fine adjustment of the charged particle beam aperture are achieved by using a single stepping motor or a piezo element. Also, instead of visually checking the amount of change in the charged particle beam image, image processing may be performed on the charged particle beam image, and the change in the charged particle beam image may be converted into a numerical value, and the adjustment may be performed based on the numerical value. As described above, when the charged particle beam aperture is electrically driven and the change of the charged particle beam image is quantified, the adjustment of the charged particle beam aperture illustrated in FIG. 4 can be easily automated, and the usability can be further improved.

Figure 6:
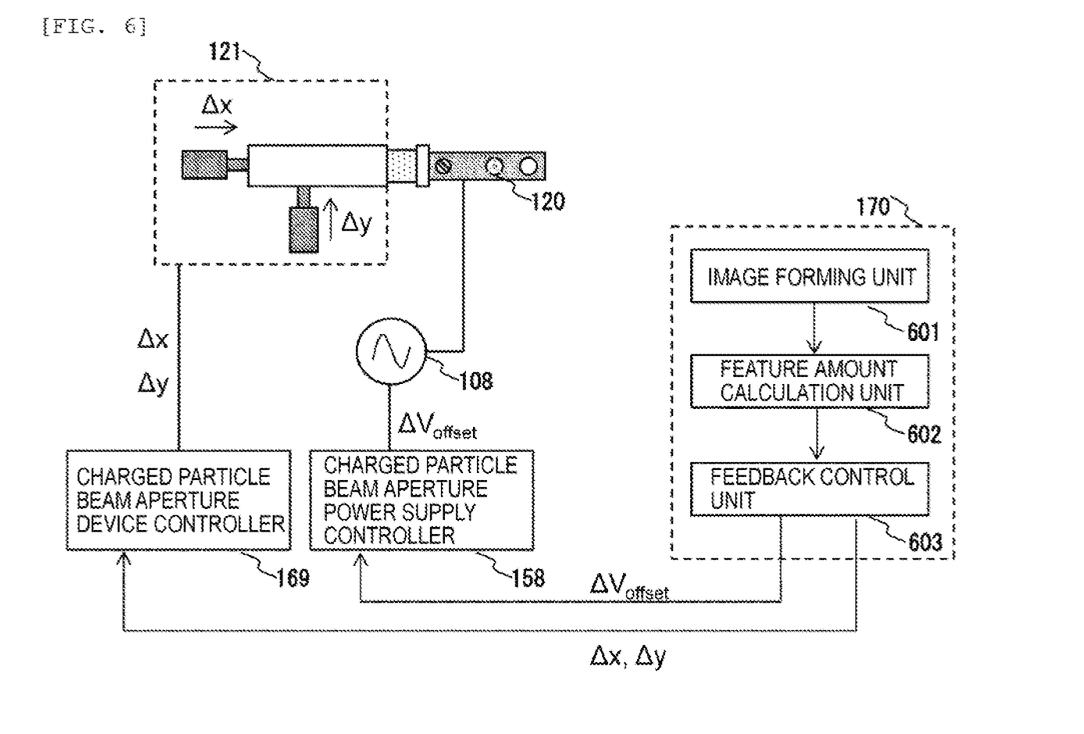
FIG. 6 is a block diagram for automating adjustment of the charged particle beam aperture.

FIG. 6 is a block diagram for automating the adjustment of the charged particle beam aperture. The integrated computer 170 is provided with an image forming unit 601, a feature amount calculation unit 602, and a feedback control unit 603. These units can be realized by storing programs corresponding to these functions in the storage device of the integrated computer 170 and executing the programs by the processor of the integrated computer 170. As a result, the operations in steps S45 and S46 illustrated in FIG. 4 are automated.

The image forming unit 601 forms a charged particle beam image based on the secondary charged particles detected by the detector 118. The feature amount calculation unit 602 calculates a feature amount of change in the charged particle beam image in synchronization with the application of the AC voltage from the charged particle beam aperture power supply 108. As the feature amount, a position movement amount of the charged particle beam image and a gray value of the charged particle beam image are calculated. The gray value of the charged particle beam image is an index of the blur amount of the image, and when the focus of the image is shifted and the amount of blur increases, the contrast decreases and the gray value decreases, and when the image is focused, the contrast increases and the gray value increases. The feedback control unit 603 determines the amount $\Delta V_{offset}$ of change in the offset voltage change according to the offset voltage Voffset or the amount of change in the feature amount due to the change in the position of the charged particle beam aperture (step S45) or determines the amount of movement ($\Delta x$, $\Delta y$) of the position of the charged particle beam aperture (step S46). In the example of FIG. 6, the feedback control unit 603 calculates the control amount from the amount of change in the feature amount of the charged particle beam image, but the amount of change in the feature amount of the charged particle beam image may be transmitted to each of the controllers 158 and 169, and each controller may determine a control amount.

Further, the position of the charged particle beam aperture is stored, the position of the charged particle beam aperture is displayed on the display 172, and the position of the charged particle beam aperture 120 adjusted in advance and the applied voltage are stored, and by simply selecting the charged particle beam aperture, the user may set the charged particle beam aperture 120 at the stored position by the charged particle beam aperture device 121 and apply an offset voltage. Accordingly, the user can easily perform observation or processing by using the charged particle beam aperture disposed at an optimum position, thereby improving usability.

REFERENCE SIGNS LIST

101: charged particle beam source
102: acceleration electrode
103: first condenser lens
104: second condenser lens
105: objective lens
108: charged particle beam aperture power supply
112: beam tube
114: sample
115: sample chamber
118: detector
120: charged particle beam aperture
121: charged particle beam
123: insulating material:
133: first deflector group
134: second deflector group
135: third deflector group
151: charged particle source controller:
152: accelerating electrode controller
153: first condenser lens controller
154: second condenser lens controller
155: objective lens controller
158: charged particle beam aperture power supply controller
163: first deflector group controller
164: second deflector group controller
165: third deflector group controller
168: detector controller
169: charged particle beam aperture controller
170: integrated computer
171: controller
172: display

The invention claimed is:

1. A charged particle beam apparatus comprising:
a charged particle beam source that generates a charged particle beam;
a first charged particle beam aperture;
a charged particle beam aperture power supply that applies a voltage to the first charged particle beam aperture;
an objective lens for focusing the charged particle beam on a sample;
a detector that detects secondary charged particles emitted by irradiating the sample with the charged particle beam; and
a computer that forms a charged particle beam image based on the secondary charged particles detected by the detector, wherein
in a state where an AC voltage is applied to the first charged particle beam aperture by the charged particle beam aperture power supply,
a position of the first charged particle beam aperture is set so that the charged particle beam image does not move and changes concentrically in synchronization with the AC voltage.

2. The charged particle beam apparatus according to claim 1, wherein
the first charged particle beam aperture is a charged particle beam aperture having an annular shape, and
in a state where the AC voltage is applied to the first charged particle beam aperture by the charged particle beam aperture power supply, an offset voltage of the AC voltage is set so that a blur amount at a maximum voltage of the AC voltage is equal to a blur amount at a minimum voltage of the AC voltage.

3. The charged particle beam apparatus according to claim 2, wherein
in a state where the charged particle beam aperture power supply applies a DC voltage having a magnitude of the offset voltage to the first charged particle beam aperture, the computer forms the charged particle beam image.

4. The charged particle beam apparatus according to claim 2, further comprising:
a second charged particle beam aperture having a circular hole shape; and
a charged particle beam aperture device that switches between the first charged particle beam aperture and the second charged particle beam aperture, wherein
in a state where an optical axis of the charged particle beam is adjusted by using the second charged particle beam aperture, the second charged particle beam aperture is switched to the first charged particle beam aperture by the charged particle beam aperture device, and the position of the first charged particle beam aperture is set.

5. The charged particle beam apparatus according to claim 1, wherein
the AC voltage is any of a sine wave, a square wave, a triangular wave, a sawtooth wave, or a composite waveform thereof.

6. A charged particle beam apparatus comprising:
a charged particle beam source that generates a charged particle beam;
a charged particle beam aperture;
a charged particle beam aperture device that moves the charged particle beam aperture;
a charged particle beam aperture control unit that controls the charged particle beam aperture device;
a charged particle beam aperture power supply that applies an AC voltage to the charged particle beam aperture;
a charged particle beam aperture power supply control unit that controls the charged particle beam aperture power supply;
an objective lens for focusing the charged particle beam on a sample;
a detector that detects secondary charged particles emitted by irradiating the sample with the charged particle beam; and
a computer that includes an image forming unit that forms a charged particle beam image based on the secondary charged particles detected by the detector, and a feature amount calculation unit that calculates a feature amount of change in the charged particle beam image synchronized with the AC voltage applied to the charged particle beam aperture, wherein the charged particle beam aperture control unit instructs the charged particle beam aperture device with an amount of movement of the charged particle beam aperture determined based on an amount of change in the feature amount due to change in a position of the charged particle beam aperture, and the charged particle beam aperture power supply control unit instructs the charged particle beam aperture power supply with an amount of change in an offset voltage of the AC voltage determined based on an amount of change in the feature amount due to change in the offset voltage of the AC voltage.

7. The charged particle beam apparatus according to claim 6, wherein
the feature amount calculation unit calculates a position movement amount or a gray value of the charged particle beam image as the feature amount.

8. The charged particle beam apparatus according to claim 6, wherein
the charged particle beam aperture device has an electric drive mechanism for moving the charged particle beam aperture.

9. The charged particle beam apparatus according to claim 6, wherein
the AC voltage is any of a sine wave, a square wave, a triangular wave, a sawtooth wave, or a composite waveform thereof.

10. The charged particle beam apparatus according to claim 6, wherein
the charged particle beam aperture is a charged particle beam aperture having an annular shape.

* * * * *